United States Patent
Hsu et al.

(10) Patent No.: US 7,960,838 B2
(45) Date of Patent: Jun. 14, 2011

(54) INTERCONNECT STRUCTURE

(75) Inventors: Yu-Hao Hsu, Taipei County (TW); Ming-Tsung Chen, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 40 days.

(21) Appl. No.: 11/164,333

(22) Filed: Nov. 18, 2005

(65) Prior Publication Data
US 2007/0114671 A1 May 24, 2007

(51) Int. Cl.
*H01L 23/48* (2006.01)
(52) U.S. Cl. .......... 257/774; 257/E21.578; 257/E23.167
(58) Field of Classification Search ............ 257/734, 257/750, 751
See application file for complete search history.

(56) References Cited

U.S. PATENT DOCUMENTS

| | | | | |
|---|---|---|---|---|
| 5,939,788 | A * | 8/1999 | McTeer | 257/751 |
| 6,008,118 | A * | 12/1999 | Yeh et al. | 438/629 |
| 6,380,065 | B1 * | 4/2002 | Komai et al. | 438/622 |
| 6,400,031 | B1 * | 6/2002 | Harada | 257/776 |
| 6,518,173 | B1 * | 2/2003 | Chan | 438/637 |
| 6,759,325 | B2 * | 7/2004 | Raaijmakers et al. | 438/633 |
| 2001/0030372 | A1 * | 10/2001 | Mori et al. | 257/903 |
| 2002/0093098 | A1 * | 7/2002 | Barr et al. | 257/751 |
| 2002/0113237 | A1 * | 8/2002 | Kitamura | 257/71 |

FOREIGN PATENT DOCUMENTS

| | | |
|---|---|---|
| CN | 1269607 | 10/2000 |
| CN | 1396647 | 2/2003 |
| CN | 1402325 | 3/2003 |

* cited by examiner

*Primary Examiner* — Benjamin P Sandvik
*Assistant Examiner* — Krista Soderholm
(74) *Attorney, Agent, or Firm* — Jianq Chyun IP Office

(57) ABSTRACT

An interconnect structure is described, disposed on a substrate with a conductive part thereon and including a dielectric layer, a composite plug and a conductive line. The dielectric layer is disposed on the substrate covering the conductive part. The composite plug is disposed in the dielectric layer electrically connecting with the conductive part, and includes a first plug and a second plug on the first plug, wherein the material or the critical dimension of the second plug is different from that of the first plug. The conductive line is disposed on the dielectric layer electrically connecting with the composite plug.

13 Claims, 7 Drawing Sheets

INTERCONNECT STRUCTURE

BACKGROUND OF THE INVENTION

1. Field of the Invention

The present invention relates to an integrated circuit structure and fabrication thereof. More particularly, the present invention relates to an interconnect structure, and to a method for fabricating the same.

2. Description of the Related Art

With the rapid development in the IC industry, the integration degree of semiconductor devices is always required higher so that the IC process linewidth is decreased unceasingly. Hence, the process window of a back-end interconnect process is decreased rapidly, especially when a via/contact hole is to be formed. This is due to the high aspect ratio of the via/contact hole, and results in quite a few problems.

FIG. 1 illustrates a cross-sectional view of a conventional contact plug of MOS transistor. The contact plug 150 is disposed between two MOS transistors 110 and 120 electrically connecting with a shared source/drain (S/D) region 130, wherein the MOS transistors 110 and 120 are covered by a dielectric layer 140 in which the contact plug 150 is formed. When the process linewidth is reduced, the contact hole 145 is shrunk but the dielectric layer 140 cannot be thinned correspondingly, so that the aspect ratio of the contact hole 145 is raised. Consequently, some dielectric material easily remains at the bottom of the contact hole 145 to cause a high contact resistance or even an open circuit and a void defect easily forms in the subsequent conductor gap-filling process, so that the reliability of the device and the yield of the product are lowered.

SUMMARY OF THE INVENTION

Accordingly, this invention provides an interconnect structure capable of solving the high aspect ratio issues to improve the device reliability and the product yield.

This invention also provides a method for fabricating an interconnect structure of this invention.

The interconnect structure of this invention is disposed on a substrate with a conductive part thereon, including a dielectric layer, a composite plug and a conductive line. The dielectric layer is disposed on the substrate covering the conductive part. The composite plug is disposed in the dielectric layer, electrically connecting with the conductive part and including a first plug and a second plug on the first plug, wherein the first plug and the second plug are different in the material or critical dimension. The conductive line is disposed on the dielectric layer, and electrically connects with the composite plug.

In the above interconnect structure, the aspect ratio of the first plug is preferably no more than 3. The first or second plug may include a material selected from the group consisting of Cu, W, Al, Mo, Au, Pt and alloys thereof.

The dielectric layer may include a lower sub-layer and an upper sub-layer, wherein the first plug is disposed in the lower sub-layer and the second plug in the upper sub-layer, and the upper sub-layer may include a low-k dielectric material. The interconnect structure may further include a protective layer between the lower and upper sub-layers of the dielectric layer, wherein the protective layer may include silicon nitride, silicon carbide (SiC), silicon oxynitride (SiON) or silicon carbonitride (SiCN).

The above interconnect structure may further includes a barrier layer between the composite plug and each of the dielectric layer and the conductive part, wherein the barrier layer may include a material selected from the group consisting of Ti, TiN, Ta, TaN, W, WN and Ti—W alloy. In addition, the conductive part may be a doped region, a gate, a combination of a doped region and a gate, or a conductive line.

The method for forming an interconnect structure of this invention is described as follows. A substrate with a conductive part thereon is provided, and then a lower dielectric layer is formed over the substrate covering the conductive part. A first plug is formed in the lower dielectric layer to electrically connect with the conductive part, and then an upper dielectric layer is formed on the lower dielectric layer and the first plug. A second plug and a conductive line are formed in the upper dielectric layer, wherein the second plug is formed between the first plug and the conductive line and electrically connects the first plug and the conductive line.

In the above method, the aspect ratio of the first plug is preferably no more than 3. The first plug may include a material selected from the group consisting of Cu, W, Al, Mo, Au, Pt and alloys thereof.

Moreover, the upper dielectric layer may include, from bottom to top, a first dielectric sub-layer, an etching stop layer and a second dielectric sub-layer, wherein the first and the second dielectric sub-layers may include a low-k material, and the etching stop layer may include silicon nitride (SiN), SiC, SiON or SiCN.

In addition, the second plug and the conductive line may be formed with the following steps. A dual damascene opening that includes a via hole exposing at least a part of the first plug and a trench above the via hole is formed in the upper dielectric layer. A conductive layer is formed filling up the dual damascene opening, and then the conductive layer outside the dual damascene opening is removed, possibly through a CMP process. A hard mask layer for defining the dual damascene opening may be further formed on the upper dielectric layer after the upper dielectric layer is formed.

Since the composite plug of this invention is formed in two stages and the aspect ratio of the partial contact/via hole in each stage is much lowered, the process windows of hole-etching and gap-filling are improved preventing a broken circuit. Hence, the invention can be used to improve the device reliability and the product yield.

It is to be understood that both the foregoing general description and the following detailed description are exemplary, and are intended to provide further explanation of the invention as claimed.

DESCRIPTION OF THE PREFERRED EMBODIMENTS

Figure 1:
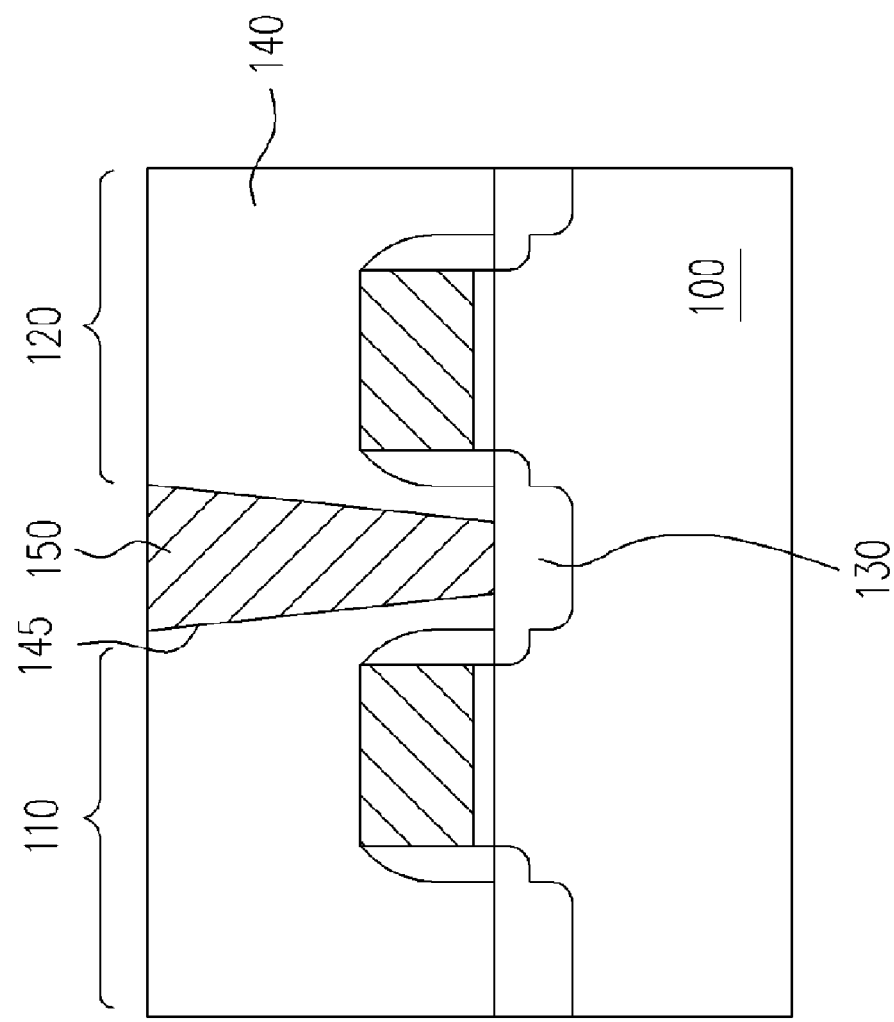
FIG. 1 illustrates a conventional contact plug of MOS transistor.
Figure 2:
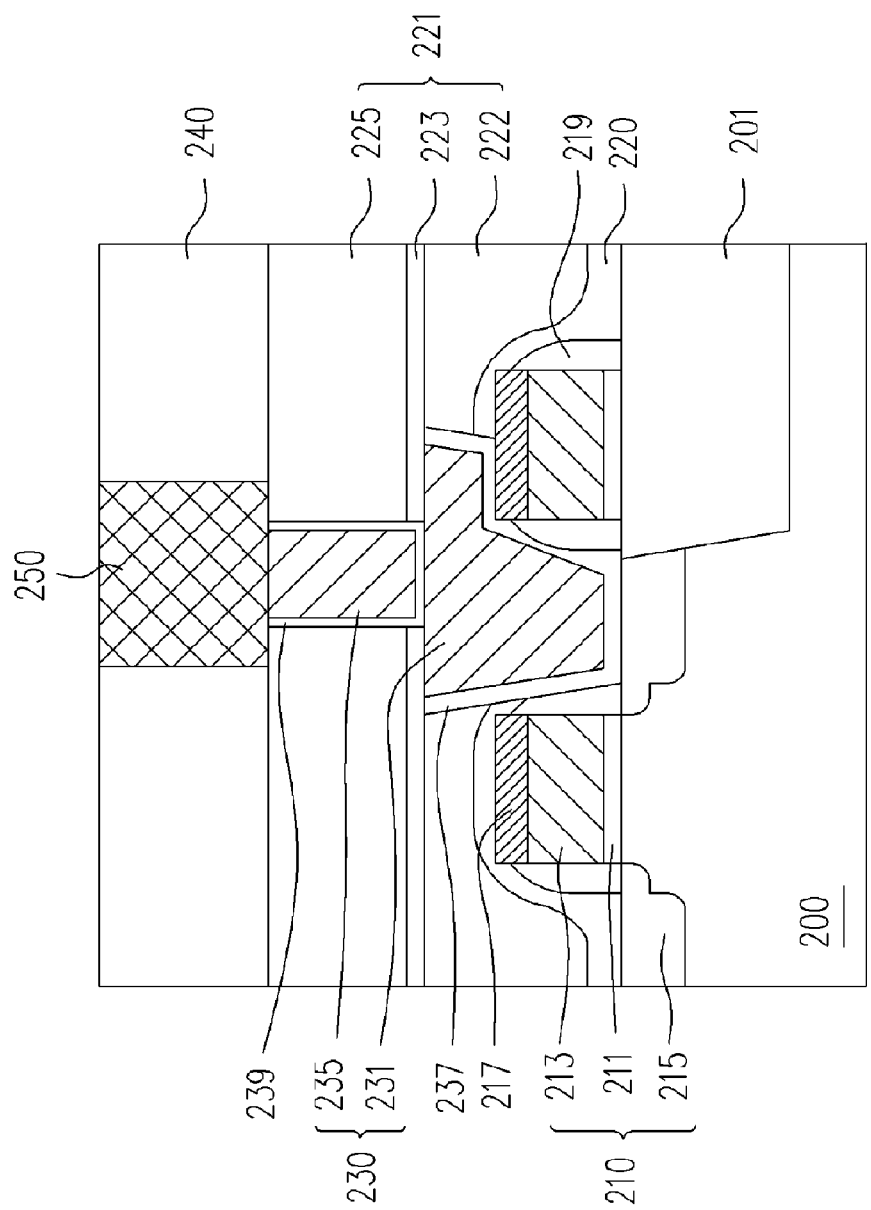
FIG. 2 illustrates an interconnect structure according to an embodiment of this invention.

Referring to FIG. 2, the interconnect structure of the embodiment is disposed on a substrate 200 having an isolation structure 201 and multiple semiconductor devices 210 thereon. Each device 210 may be a MOS transistor including gate dielectric 211 on the substrate 200, a gate 213 on the gate dielectric 211, and S/D regions 215 in the substrate 200 beside the gate 213, wherein the gate dielectric 211 may include SiO, the gate 213 includes a conductive material like doped polysilicon or metal, and the S/D regions 215 are p+-doped or n+-doped. A metal silicide layer 217 including TiSi, CoSi, NiSi or PtSi may be further disposed on the gate 213, and the sidewall of the gate 213 may be further disposed with a spacer 219 possibly composed of SiN. An etching stop layer 220, such as a SiN layer, may be further disposed on the devices 210.

The aforementioned structure is covered by a dielectric layer 221, in which a composite plug 230 is disposed electrically connecting with a conductive part of the devices 210. In this case, the conductive part may be an S/D region 215 or a gate 213, or a combination thereof. Accordingly, the composite plug 230 may be a contact plug merely connected to an S/D region 215 or a gate 213, or a share contact plug electrically connecting with an S/D region 215 and a gate 213 as shown in FIG. 2.

The dielectric layer 221 may include lower and upper dielectric sub-layers 222 and 225, and simultaneously the composite plug 230 may include lower and upper parts being a first plug 231 and a second plug 235 respectively in the lower sub-layer 222 and the upper sub-layer 225. The first plug 231 and the second plug 235 are different in the material or critical dimension (CD). In some embodiments, the CD of the second plug 235 is smaller than that of the first plug 231.

In addition, the material of the first/second plug 231/235 may be selected from aluminum (Al), copper (Cu), tungsten (W), molybdenum (Mo), gold (Au), platinum (Pt) and alloys thereof. The plug material may be an alloy simply containing two or more metals mentioned above like Al—Cu alloy, or an alloy of metal and semi-metal like Si-doped Al-alloy, Cu-alloy or Al—Cu alloy. The materials of the first and the second plugs 231 and 235 may be the same or different. Besides, a barrier layer 237 may be further disposed between the first plug 231 and each of the lower dielectric sub-layer 222, the S/D region 215 and the spacer 219, and another barrier layer 239 may be further disposed between the second plug 235 and each of the upper dielectric sub-layer 225 and the first plug 231. The material of the barrier layer 237 or 239 may be Ti, TiN, Ta, TaN, W, WN or Ti—W alloy.

The material of the lower dielectric sub-layer 222 may be SiO or BPSG, and that of the upper dielectric sub-layer 225 may be SiO or a low-k material with a dielectric constant less than 4.0 like HSG, FSG, Flare, SILK, carbon-doped oxide (CDO), hydrogenated amorphous carbon (HAC), fluorinated amorphous carbon (FAC), Parylene, poly(arylene ether) (PAE), Cyclotene, SiO$_2$ aerogel, SiO$_2$ Xerogel or a combination thereof. A protective layer 223, such as a SiN, SiC, SiON or SiCN layer, may be further disposed between the lower and upper dielectric sub-layers 222 and 225.

The upper dielectric sub-layer 225 and the composite plug 230 is covered by another dielectric layer 240, in which a conductive line 250 is disposed electrically connecting with the composite plug 230. The material of the dielectric layer 240 may be SiO, BPSG or any low-k material mentioned above, while that of the conductive line 250 may be Cu, W, Al, Mo, Au, Pt or an alloy thereof.

It is noted that though the composite plug of this invention is exemplified as a share contact plug connecting with an S/D region and a gate in the above embodiment, the composite plug is not restricted to a contact plug but can be a via plug electrically connected to a conductive line in an interconnect structure. Since the composite plug is formed from lower and upper parts and the aspect ratio of the partial contact/via hole corresponding to each part is much lowered, the process windows of hole-etching and gap-filling are improved preventing a broken circuit. Therefore, the device reliability and the product yield can be improved.

FIG. 3A to FIG. 3E illustrate, in a cross-sectional view, an interconnect process according to the preferred embodiment of this invention. The interconnect process may be applied to an SRAM fabricating process.

Figure 3A:
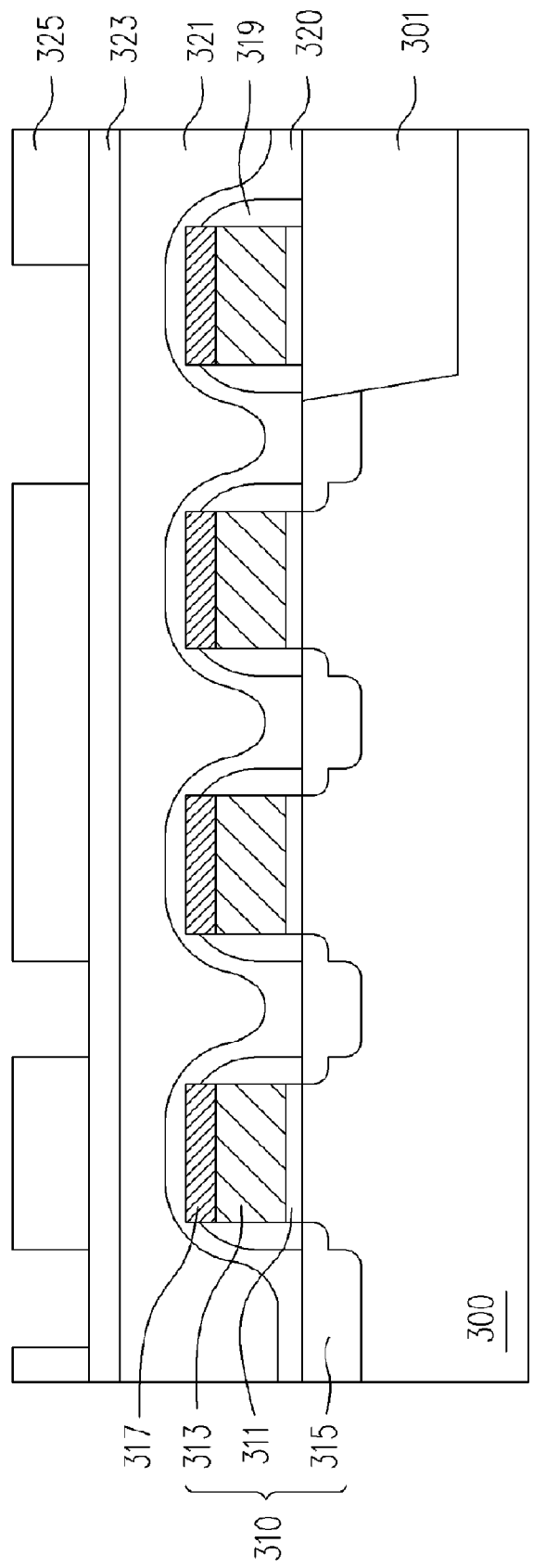
FIG. 3A to FIG. 3E illustrate, in a cross-sectional view, an interconnect process according to a preferred embodiment of this invention.

Referring to FIG. 3A, a substrate 300 with an isolation structure 301 and multiple semiconductor devices 310 thereon is provided. The isolation structure 301 may be a shallow trench isolation (STI) structure that can be formed with any suitable method in the prior art. The devices 310 may include MOS transistors, each of which includes gate dielectric 311 on the substrate 300, a gate 313 on the gate dielectric 311 and two S/D regions 315 in the substrate 300 beside the gate 313. The gate dielectric 311 may include SiO, the gate 313 may include a conductive material like doped poly-Si or metal and the S/D regions 315 are p+-doped or n+-doped. A metal silicide layer 317, possibly including TiSi, NiSi or CoSi, may be formed on each gate 313 to lower the resistance thereof, and a spacer 319 possibly including SiO or SiN may be further disposed on the sidewall of each gate 313.

Referring to FIG. 3A again, an etching stop layer 320 is then formed over the substrate 300 covering the devices 310, possibly including SiN and formed with CVD. A lower dielectric layer 321 is then formed on the etching stop layer 320 covering the devices 310, having a planar top surface slightly higher than that of the devices 310 and possibly including SiO or BPSG. Such a lower dielectric layer 321 can be formed by firstly forming a layer of a dielectric material through CVD and then planarizing the layer of the dielectric material.

Thereafter, a hard mask layer 323 is formed on the dielectric layer 321, possibly including SiN, SiC, SiON or SiCN and formed through CVD. A patterned photoresist layer 325 is then formed on the hard mask layer 323, possibly by spin-coating the hard mask layer 323 with a layer of a photoresist material and then exposing and developing the photoresist material, which is usually an organic photosensitive material.

Figure 3B:
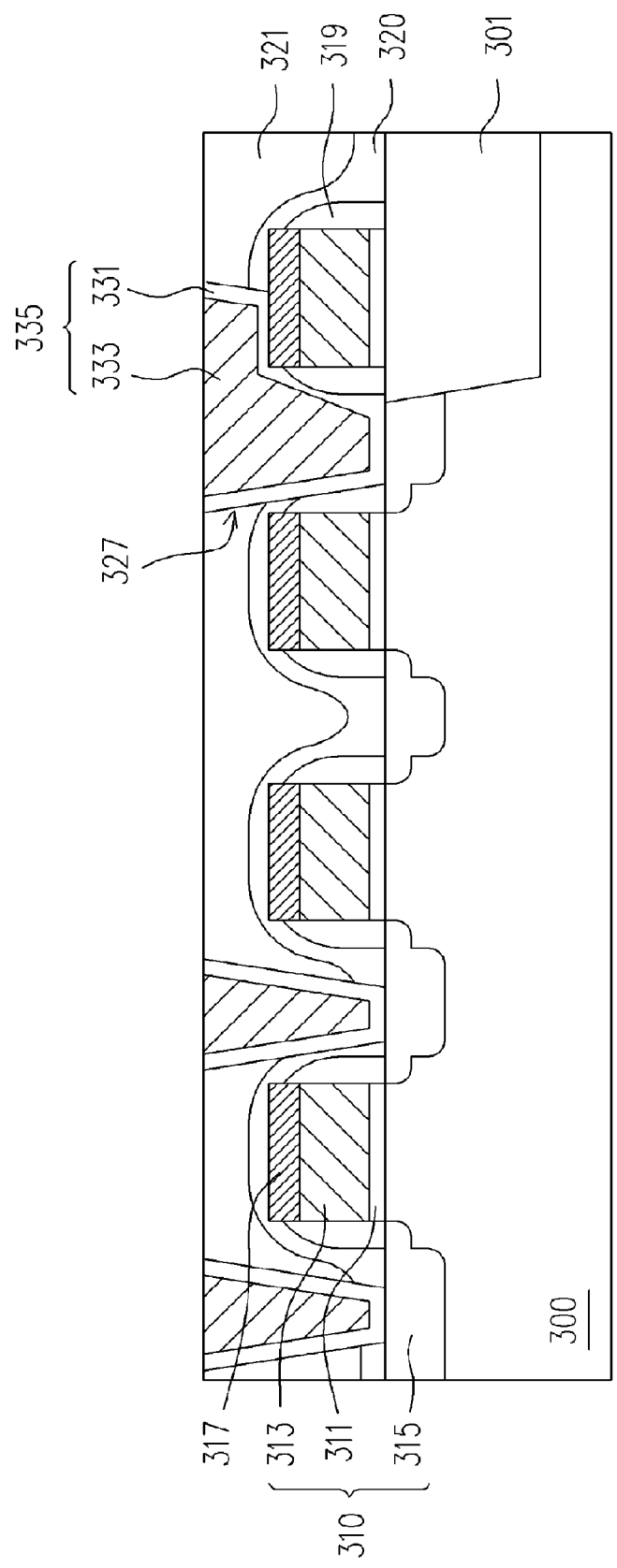

Referring to FIGS. 3A and 3B, the hard mask layer 323, the lower dielectric layer 321 and the etching stop layer 320 not covered by the photoresist layer 325 are etched away to form an opening 327, possibly with a reactive-ion etching (RIE) process. The plasma-generating gas composition used in the etching step may be adjusted timely for the different materials of the layers being etched. Because the materials of the etching stop layer 320 and the lower dielectric layer 321 are different, the etching is stopped on the etching stop layer 320 not damaging the gate 313 and the S/D region 315.

Thereafter, the residual photoresist layer 325 is removed, and then the etching stop layer 320 exposed in the opening 327 is removed by, for example, wet etching, so that the opening 327 exposes the S/D region 315 and the metal silicide layer 317 on the gate 313. It is also noted that not every device 310 is exposed by an opening, and the openings on some devices 310 may merely expose their S/D regions 315. The distribution and shapes of the openings depend on the circuit design.

Referring to FIG. 3B again, a barrier layer 331 and a conductive layer 333 are formed over the substrate 300 filling up the opening 327, and then the conductive layer 333, the barrier layer 331 and the hard mask layer 323 on the lower dielectric layer 321 are removed to form a first plug 335, possibly through CMP. The barrier layer 331 may include Ti, TiN, Ta, TaN, W, WN or Ti—W alloy, etc., and can be formed through PVD or CVD. The conductive layer 333 may be formed through CVD or PVD, and may include Cu, W, Al, Mo, Au, Pt or an alloy thereof optionally doped with silicon.

Since in the above process the top surface of the lower dielectric layer 321 is slightly higher than that of the device 310, the aspect ratio of the opening 327 is quite low increasing the process window. The aspect ratio of the opening 327 is preferably no more than 3.0, and can be 1.5 or less in some embodiments.

Figure 3C:
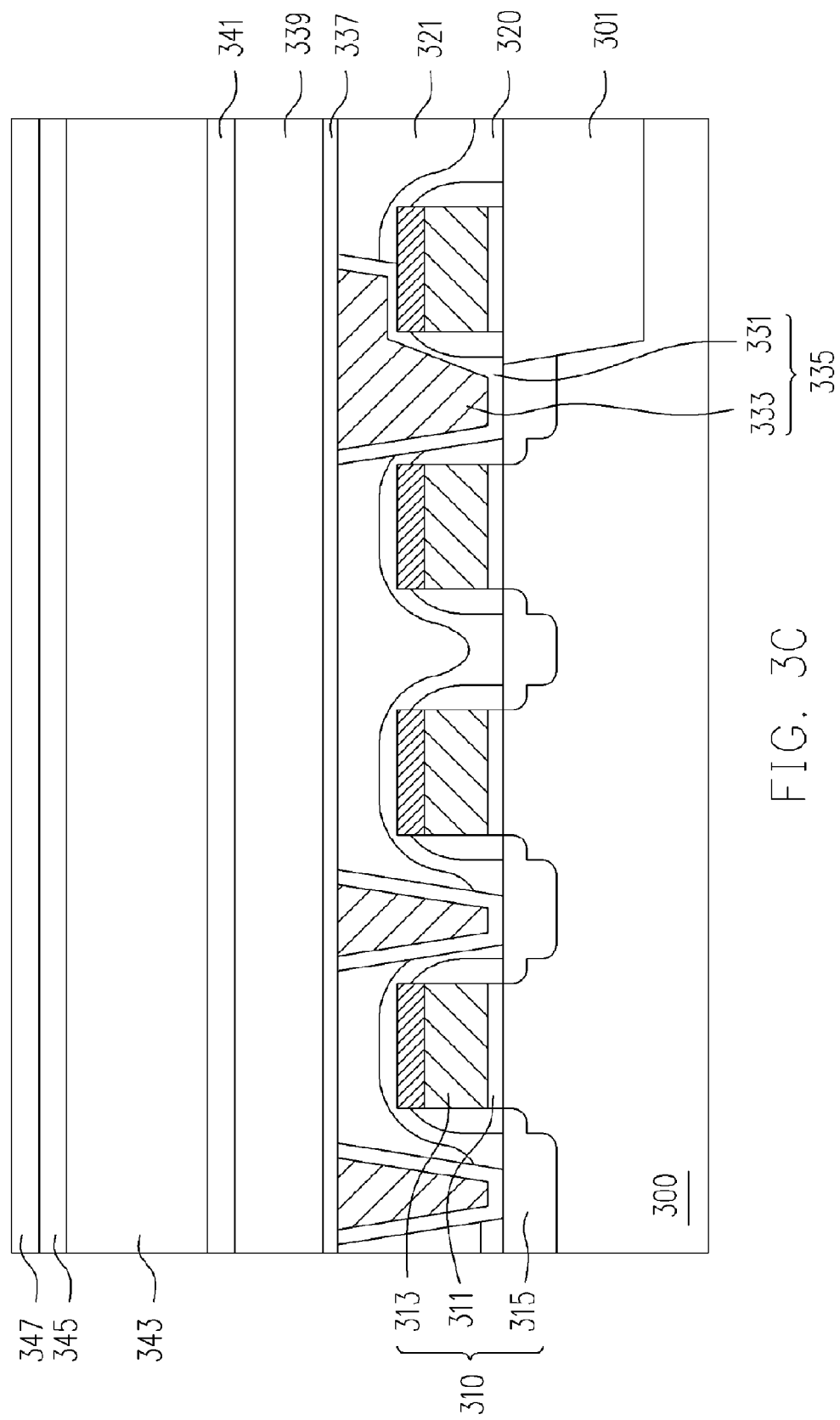

Referring to FIG. 3C, a protective layer 337, a dielectric layer 339, an etching stop layer 341, another dielectric layer 343, a cap layer 345 and a hard mask layer 347 are sequentially formed on the lower dielectric layer 321 and the first plug 335. The protective layer 337 may include SiN, SiC, SiON or SiCN, and may be formed through CVD. The material of the dielectric layer 339 may be SiO, or a low-k material with a dielectric constant less than 4 like HSQ, FSG, Flare, SILK, CDO, HAC, KF, FAC, Parylene, PAE, Cyclotene, $SiO_2$ aerogel, $SiO_2$ xerogel or a combination thereof. The dielectric layer 339 may be formed through CVD or spin-on coating.

The etching stop layer 341 may include SiN, SiC, SiON or SiCN, and may be formed through CVD. The dielectric layer 343 may include SiO or a low-k material mentioned above, and may be formed through CVD or spin-coating. The cap layer 345 may include TEOS—SiO, and may be formed through CVD. The hard mask layer 347 may include TiN, and may be formed with CVD.

It is noted that the protective layer 337, the etching stop layer 341, the cap layer 345 and the hard mask layer 347 are formed to facilitate the control of the subsequent patterning process, so that the photomask pattern can be transferred more accurately and the films that should not be etched can be protected. Nevertheless, the formation of these films or other types of films like an anti-reflection layer or a wetting layer is optional according to the requirements of the process.

Figure 3D:
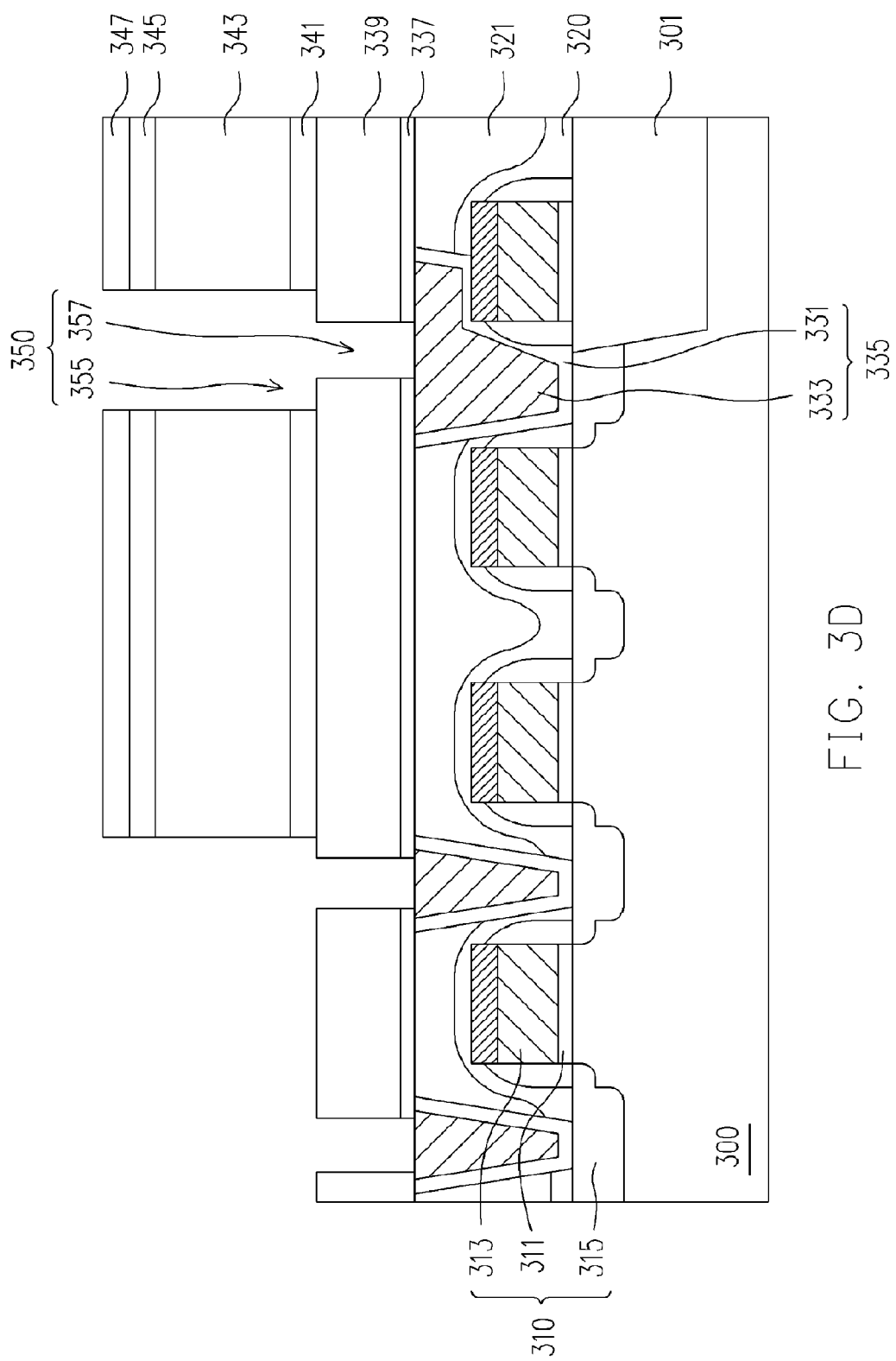

Referring to FIG. 3D, a dual damascene opening 350 is formed in the hard mask layer 347, the cap layer 345, the dielectric layer 343, the etching stop layer 341, the dielectric layer 339 and the protective layer 337, including a via hole 357 exposing at least a part of the first plug 335 and a trench 355 above the via hole 357. The via hole 357 can be formed before or after the trench 355 is formed, and the method for etching these films may include an RIE process where the plasma-generating gas composition is adjusted several times for the different materials of these films. Because the dual damascene process is well known in the art, it is not further described in details.

Figure 3E:
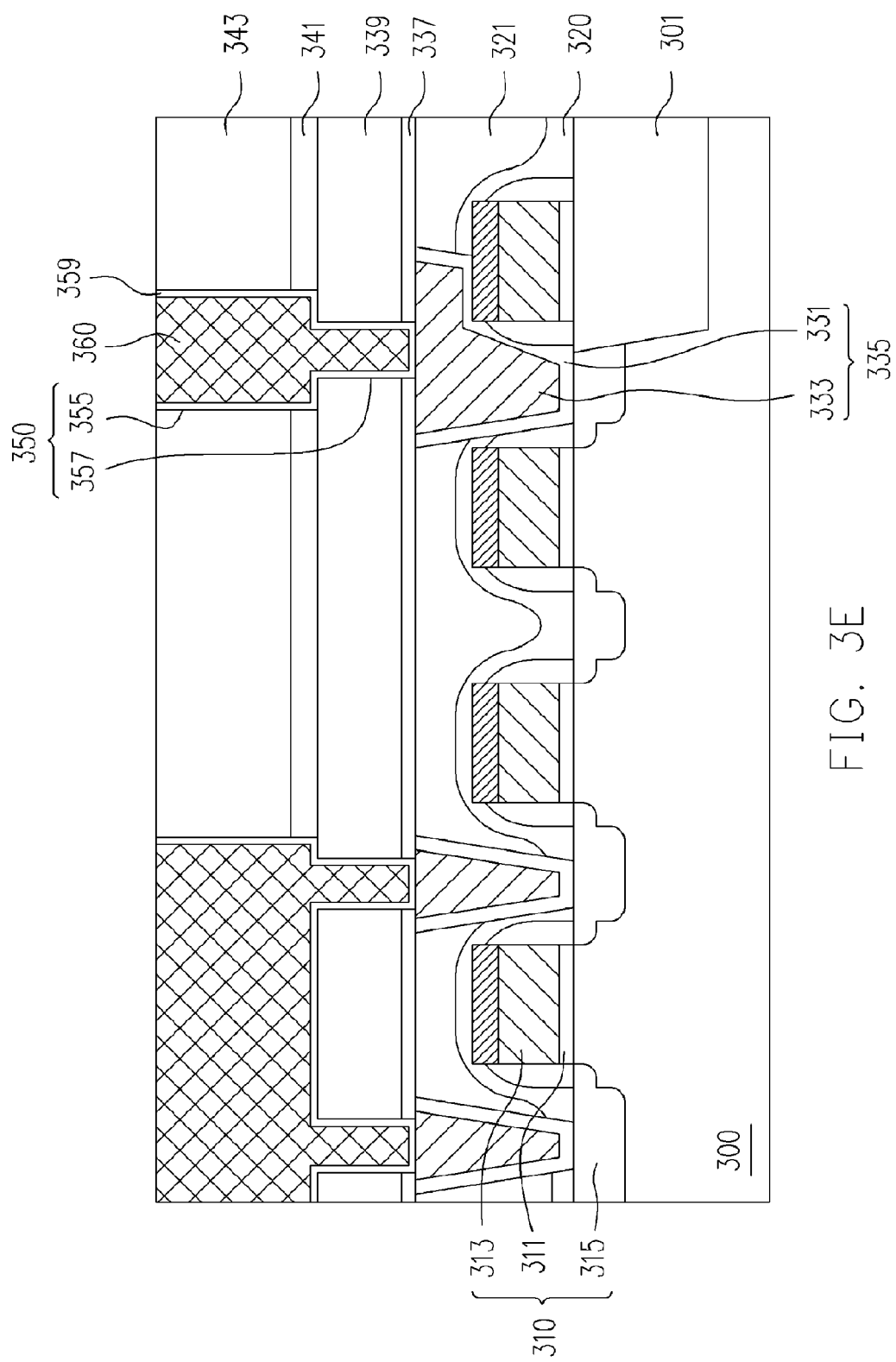

Referring to FIG. 3E, a barrier layer 359 and a conductive layer 360 are formed filling up the dual damascene opening 350, and then the conductive layer 360, the barrier layer 359, the hard mask layer 347 and the cap layer 345 on the dielectric layer 343 is removed, possibly through CMP. The barrier layer 359 may include Ti, TiN, Ta, TaN, W, WN or Ti—W alloy, and may be formed with CVD. The conductive layer 360 may be formed through CVD or PVD, and may include Cu, W, Al, Mo, Au, Pt or an alloy thereof. The portion of the conductive layer 360 in the trench 355 serves as a conductive line, which is electrically connected with the first plug 335 via the portion of the conductive layer 360 in the via hole 357 that serves as a second plug.

Since the composite plug of this invention is formed in two stages and the aspect ratio of the partial contact/via hole in each stage is much lowered, the process windows of hole-etching and gap-filling are improved preventing a broken circuit. Hence, the invention can be used to improve the device reliability and the product yield.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An interconnect structure, disposed on a substrate with a conductive part thereon and comprising:
   a dielectric layer on the substrate, covering the conductive part;
   a composite contact plug or via plug in the dielectric layer comprising:
      a first contact plug or via plug extending vertically; and
      a second contact plug or via plug, extending vertically, directly on the first contact plug or via plug,
      wherein a top portion of the first contact plug or via plug and a bottom portion of the second contact plug or via plug are different in critical dimension, the first contact plug or via plug is disposed just above the conductive part and a bottom surface of the first contact plug or via plug electrically connects with the conductive part;
   a first barrier layer disposed between the first contact plug or via plug and the second first contact plug or via plug; and
   a conductive line on the dielectric layer, electrically connecting with the composite contact plug or via plug.

2. The interconnect structure of claim 1, wherein an aspect ratio of the first contact plug or via plug is no more than 3.

3. The interconnect structure of claim 1, wherein the first contact plug or via plug comprises a material selected from the group consisting of Cu, W, Al, Mo, Au, Pt and alloys thereof.

4. The interconnect structure of claim 1, wherein the second contact plug or via plug comprises a material selected from the group consisting of Cu, W, Al, Mo, Au, Pt and alloys thereof.

5. The interconnect structure of claim 1, wherein the dielectric layer comprises a lower sub-layer and an upper sub-layer, and the first contact plug or via plug is disposed in the lower sub-layer and the second contact plug or via plug in the upper sub-layer.

6. The interconnect structure of claim 5, wherein the upper sub-layer comprises a low-k material.

7. The interconnect structure of claim 5, further comprising a protective layer between the lower sub-layer and the upper sub-layer of the dielectric layer.

8. The interconnect structure of claim 7, wherein the protective layer comprises SiN, SiC, SiON or SiCN.

9. The interconnect structure of claim 1, further comprising a second barrier layer between the composite contact plug or via plug and each of the dielectric layer.

10. The interconnect structure of claim 9, wherein the first and the second barrier layers comprise a material selected from the group consisting of Ti, TiN, Ta, TaN, W, WN and Ti—W alloy respectively.

11. The interconnect structure of claim 1, wherein the conductive part comprises a doped region, a gate, a combination of a doped region and a gate, or a conductive line.

12. An interconnect structure, disposed on a substrate with a doped region thereon and comprising:
   a dielectric layer on the substrate, covering the doped region;
   a first contact plug or via plug, extending vertically, in the dielectric layer, having a bottom surface electrically connecting with the doped region; and a dual damascene structure in the dielectric layer, electrically connecting with the first contact plug or via plug, and comprising
    a second contact plug or via plug, extending vertically, directly on the first contact plug or via plug including an interface therebetween; and
    a conductive line on second contact plug or via plug without an interface therebetween,
    wherein a top portion of the first contact plug or via plug and a bottom portion of the second contact plug or via plug are different in critical dimension.

13. The interconnect structure of claim 12, wherein a barrier layer between the first contact plug or via plug and the second contact plug or via plug.

* * * * *